US008906459B2

(12) United States Patent
Kim

(10) Patent No.: US 8,906,459 B2
(45) Date of Patent: Dec. 9, 2014

(54) METHOD OF FORMING ORGANIC LAYER AND METHOD OF MANUFACTURING ORGANIC LIGHT EMITTING DEVICE HAVING THE SAME

(71) Applicant: Samsung Display Co., Ltd., Yongin (KR)

(72) Inventor: SungWoong Kim, Yongin (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 13/960,602

(22) Filed: Aug. 6, 2013

(65) Prior Publication Data

US 2014/0315341 A1      Oct. 23, 2014

(30) Foreign Application Priority Data

Apr. 19, 2013  (KR) .......................... 10-2013-0043789

(51) Int. Cl.

| | |
|---|---|
| B05D 3/04 | (2006.01) |
| B05D 3/10 | (2006.01) |
| H01L 21/00 | (2006.01) |
| H01L 51/00 | (2006.01) |
| H01L 35/24 | (2006.01) |
| H01L 29/08 | (2006.01) |
| H01L 51/56 | (2006.01) |
| H01L 51/50 | (2006.01) |

(52) U.S. Cl.
CPC ......... *H01L 51/0005* (2013.01); *H01L 2251/10* (2013.01); *H01L 51/0004* (2013.01); *H01L 51/0003* (2013.01); *H01L 51/56* (2013.01); *H01L 51/5012* (2013.01); *H01L 51/0007* (2013.01)
USPC ................................ 427/336; 438/46; 257/40

(58) Field of Classification Search
CPC ........ H01L 51/0003–51/0007; H01L 51/5012; H01L 51/56
USPC ................... 438/46; 257/40; 427/336
See application file for complete search history.

(56) References Cited

U.S. PATENT DOCUMENTS

| | | | | |
|---|---|---|---|---|
| 7,186,439 | B2 * | 3/2007 | Nakano et al. ................... | 427/66 |
| 7,368,145 | B2 * | 5/2008 | Ito et al. ........................... | 427/66 |
| 7,775,845 | B2 * | 8/2010 | Fukase et al. .................... | 445/23 |
| 2003/0211643 | A1 * | 11/2003 | Fujimori et al. ................ | 438/22 |
| 2005/0067949 | A1 * | 3/2005 | Natarajan et al. .............. | 313/504 |
| 2009/0134778 | A1 * | 5/2009 | Nishizeki et al. ............. | 313/504 |

FOREIGN PATENT DOCUMENTS

| | | |
|---|---|---|
| JP | 2008-243542 | 10/2008 |
| KR | 10-2010-0088768 | 8/2010 |

* cited by examiner

*Primary Examiner* — Karen Kusumakar
(74) *Attorney, Agent, or Firm* — Knobbe Martens Olson & Bear LLP

(57) ABSTRACT

A method of forming an organic layer includes supplying a liquefied organic material, drying the liquefied organic material, supplying a solvent to an intermediate organic layer to swell the intermediate organic layer, and drying the swelled organic layer. The organic layer is formed to have a uniform thickness when the organic layer is formed by a solution-based printing method.

20 Claims, 12 Drawing Sheets

METHOD OF FORMING ORGANIC LAYER AND METHOD OF MANUFACTURING ORGANIC LIGHT EMITTING DEVICE HAVING THE SAME

CROSS-REFERENCE TO RELATED APPLICATIONS

This application claims priority to Korean Patent Application No. 10-2013-0043789, filed on Apr. 19, 2013, the content of which is hereby incorporated by reference in its entirety.

BACKGROUND

1. Field

The present disclosure relates to a method of forming a flat organic layer and a method of manufacturing an organic light emitting device having the organic layer.

2. Description of the Related Technology

In general, a solution-based printing method performs a patterning process on a layer in a large-scale area without performing complicated processes, such as for example, a vacuum process, an etch process, and the like. Accordingly, the solution-based printing method is widely used to form a color filter of a liquid crystal display, or an organic layer of an organic light emitting device. The solution-based printing method discharges a solution, such as, for example, an ink, which can be obtained by dissolving an organic material, to a desired position to form the organic layer. The discharged ink becomes the organic layer after a solvent contained in the ink is dried.

An organic light emitting device is a self-emissive device and has advantages, such as low power consumption, fast response rate, wide viewing angle, high contrast ratio, etc. The organic light emitting device is configured to include an organic light emitting layer that generates excitons to emit a light, and electrodes. The organic layer is generally formed by a solution-based printing method. However, when the organic layer is formed by a solution-based printing method, a thickness of the organic layer becomes non-uniform, and a surface of the organic layer becomes concave or convex. The concave or convex surface causes a decrease of reliability of the device, such as a non-uniform brightness in a light emission area of a pixel, a reduction of life span of the device, etc.

SUMMARY OF CERTAIN INVENTIVE ASPECTS

The present disclosure provides a method of forming a flat organic layer.

The present disclosure provides a method of manufacturing an organic light emitting device having the flat organic layer.

Embodiments provide a method of forming an organic layer including supplying a liquefied organic material on a base substrate, drying the liquefied organic material to form an intermediate organic layer, supplying a solvent to the intermediate organic layer to form a swelled organic layer, and drying the swelled organic layer to form a flat organic layer.

When the intermediate organic layer has a convex surface structure, the solvent has a low boiling point.

The solvent is at least one of propyleneglycolmonomethylether acetate, cyclohexanone, ethyl-3-ethoxypropionate, 3-methoxy-n-butylacetate, diethyleneglycolethylmethylether, diethyleneglycoldiethylether, anisole, 4-methoxytoluene, cyclohexanol, 2,3-butanediol, propane-1,2-diol, diethyleneglycol monomethyletheracetate, mesitylene, methylbenzoate, or a mixture thereof.

When the intermediate organic layer has a concave surface structure, the solvent has a high boiling point.

The solvent is at least one of cyclohexylbenzene, 1,3-dimethyl-2-imidazolidinone, diethyleneglycolmonobutylether acetate, dibenzylether, diethylphthalate, dodecylbenzene, 1,2,3,4-tetramethylbenzene, 3-isopropylbiphenyl, 3-methylbiphenyl, 1,2,3,4-tetrahydronaphthalene, or a mixture thereof.

The liquefied organic material is supplied by an inkjet printing method or a nozzle printing method.

The solvent is supplied by an inkjet printing method or a nozzle printing method.

The method further includes forming at least one barrier wall on the base substrate to form an area to which the organic material is supplied.

Embodiments provide a method of manufacturing an organic light emitting device including forming a first electrode on a base substrate, forming an organic light emitting layer on the first electrode, and forming a second electrode on the organic light emitting layer. The forming of the organic light emitting layer includes supplying a liquefied organic light emitting material on a base substrate, drying the liquefied organic light emitting material to form an intermediate organic light emitting layer, supplying a solvent to the intermediate organic light emitting layer to form a swelled organic light emitting layer, and drying the swelled organic light emitting layer to form a flat organic light emitting layer.

When the intermediate organic light emitting layer has a convex surface structure, the solvent has a low boiling point.

When the intermediate organic light emitting layer has a concave surface structure, the solvent has a high boiling point.

The method further includes forming a hole injection layer on the first electrode.

The forming of the hole injection layer includes supplying a liquefied hole injection material on the first electrode, drying the liquefied hole injection material to form an intermediate hole injection layer, supplying a solvent to the intermediate hole injection layer to form a swelled hole injection layer, and drying the swelled hole injection layer to form a flat hole injection layer.

The method further includes forming a hole transporting layer on the hole injection layer.

The forming of the hole transporting layer includes supplying a liquefied hole transporting material on the first electrode, drying the liquefied hole transporting material to form an intermediate hole transporting layer, supplying a solvent to the intermediate hole transporting layer to form a swelled hole transporting layer, and drying the swelled hole transporting layer to form a flat hole transporting layer.

The method further includes forming an electron injection layer on the organic light emitting layer.

The method further includes forming an electron transporting layer on the organic light emitting layer after forming the organic light emitting layer and before forming the electron injection layer.

The organic light emitting material is supplied by an inkjet printing method or a nozzle printing method.

The solvent is supplied by an inkjet printing method or a nozzle printing method.

The first electrode may be applied with a first voltage and the second electrode may be applied with a second voltage different than the first voltage.

According to the above, the organic layer provided in each pixel has a uniform thickness and the surface of the organic layer is flat. Thus, an electric field may be uniformly formed in the organic light emitting layer and a reliability of the organic light emitting device may be improved.

BRIEF DESCRIPTION OF THE DRAWINGS

The above and other advantages of the present disclosure will become readily apparent by reference to the following detailed description when considered in conjunction with the accompanying drawings wherein.

DETAILED DESCRIPTION OF CERTAIN INVENTIVE EMBODIMENTS

Figure 1A:
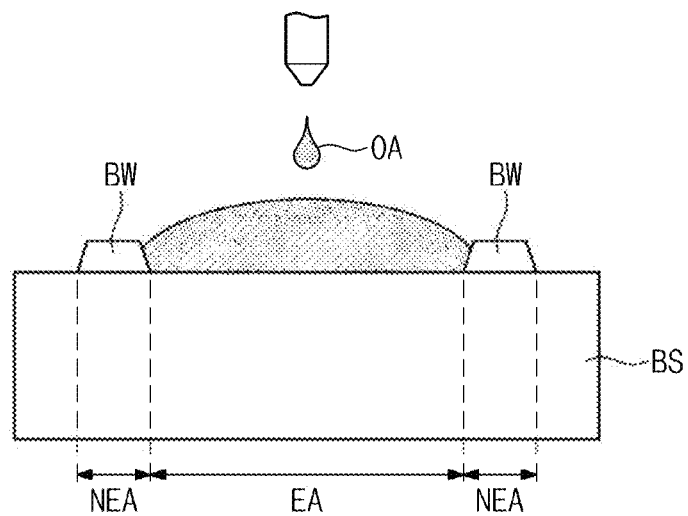
FIGS. 1A to 1E are views showing a method of forming an organic layer according to an embodiment.

It will be understood that when an element or layer is referred to as being "on", "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present. Like numbers generally refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the present invention will be explained in detail with reference to the accompanying drawings.

FIGS. 1A to 1E are views showing a method of forming an organic layer according to an embodiment.

Referring to FIGS. 1A to 1E, the method of forming the organic layer includes supplying a liquefied organic material OA, drying the organic material OA, supplying a solvent to an intermediate organic layer OA1 to swell the intermediate organic layer OA1, and drying the swelled organic layer OA2.

FIG. 1A shows the supplying of the liquefied organic material OA.

Referring to FIG. 1A, the liquefied organic material OA is supplied on a base substrate BS. The organic material OA includes an initial solvent, and organic solutes dissolved in the initial solvent. The organic material OA includes an organic light emitting material, a hole injection material, and a hole transporting material. The organic light emitting material includes at least one of a red organic light emitting material, a green organic light emitting material, or a blue organic light emitting material. The base substrate BS includes a barrier wall BW to define a first area EA on the base substrate BS, in which the organic material OA is provided. The area in which the barrier wall BW is disposed is referred to as a second area NEA, and the first area EA is surrounded by the second area NEA. The organic material OA is provided to the first area EA such that the organic material OA does not overflow beyond the barrier wall BW. Different from the base substrate BS shown in FIGS. 1A to 1E, the base substrate BS may not include the barrier wall BW. The organic material OA may be provided by a solution-based printing method, such as, for example, an inkjet printing method, a nozzle printing method, etc. The inkjet printing method discharges the organic material onto the first area EA in a droplet shape. The nozzle printing method continuously discharges the organic material OA onto the first area EA through nozzles. The discharged organic material OA forms a layer with a convex surface structure in the first area EA.

Figure 1B:
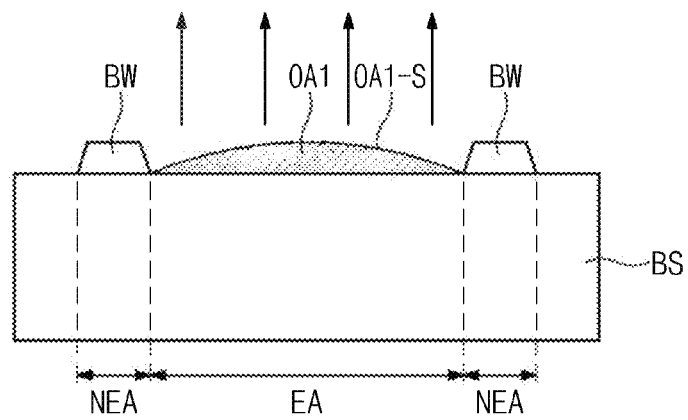

FIG. 1B shows the drying of the organic material OA.

Referring to FIG. 1B, the initial solvent contained in the organic material OA provided on the base substrate BS is dried by the drying process. The organic solutes remain on the base substrate BS to form the intermediate organic layer OA1 in the first area EA of the base substrate BS.

The drying process is performed in a vacuum state by a vacuum drying method.

The intermediate organic layer OA1 has a thickness that gradually decreases toward an end portion of the first area EA from a center portion of the first area EA. Thus, a surface OA1-S of the intermediate organic layer OA1 has a convex structure. The structure of the surface OA1-S of the intermediate organic layer OA1 is determined depending on the initial solvent of the organic material OA.

Figure 2:
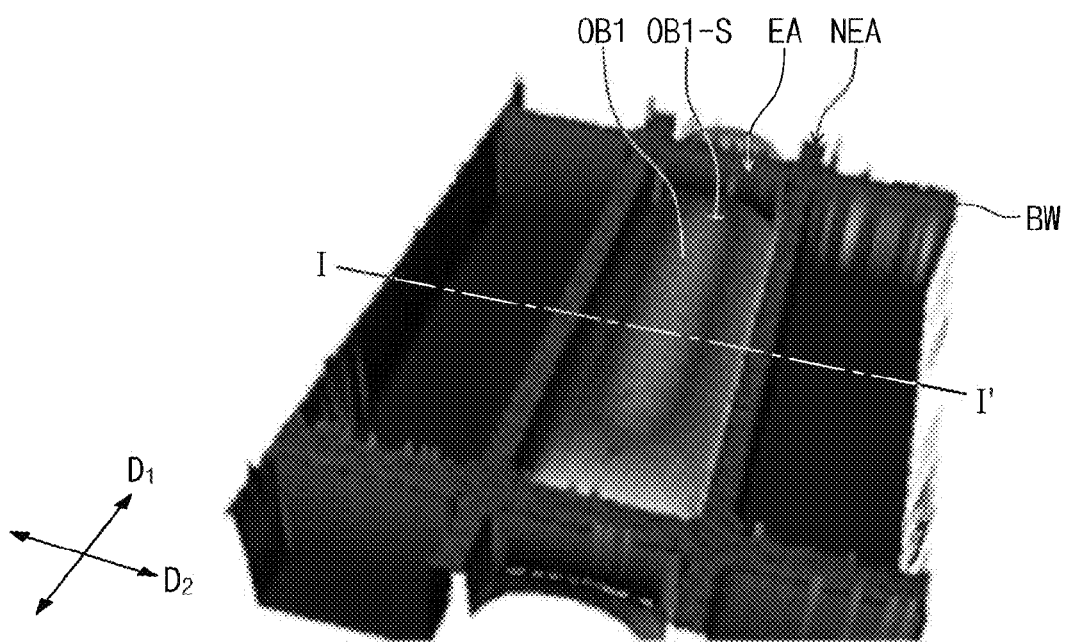
FIG. 2 is a three-dimensional profile view showing an intermediate organic layer according to an embodiment.
Figure 3:
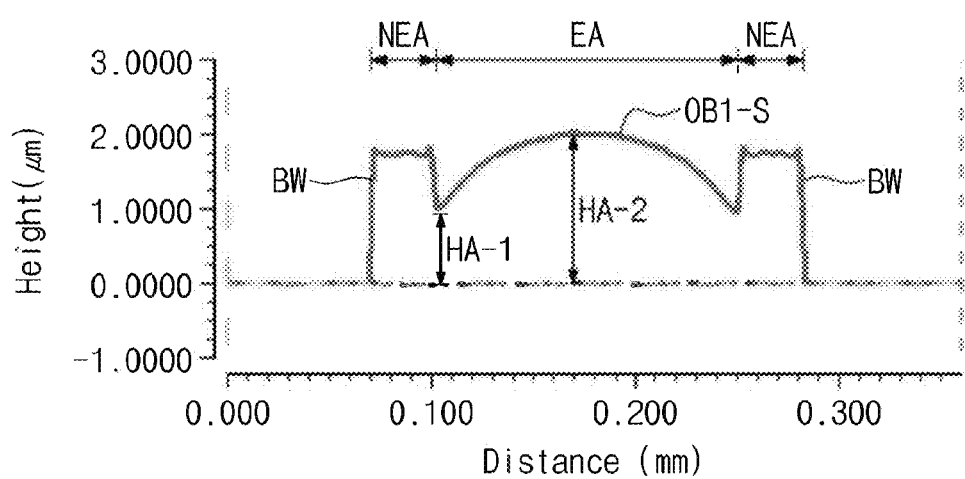
FIG. 3 is a cross-sectional profile view taken along a line I-I' shown in FIG. 2.

FIG. 2 is a three-dimensional profile view showing the intermediate organic layer, which is convex, according to an embodiment and FIG. 3 is a cross-sectional profile view taken along a line I-I' shown in FIG. 2.

Referring to FIGS. 2 and 3, the barrier wall BW has a length of about a few hundreds of micrometers in first and second directions D1 and D2 on the base substrate BS, and a height of about a few micrometers. The barrier wall BW is disposed on the base substrate BS in a lattice shape to define a plurality of pixels.

The intermediate organic layer OA1 has the convex surface structure in the first area EA. A difference between a thickness HA-2 of the intermediate organic layer OA1 at the center portion of the first area EA and a thickness HA-1 of the intermediate organic layer OA1 at the end portion of the first area EA is about a few hundreds of nanometers.

Figure 1C:
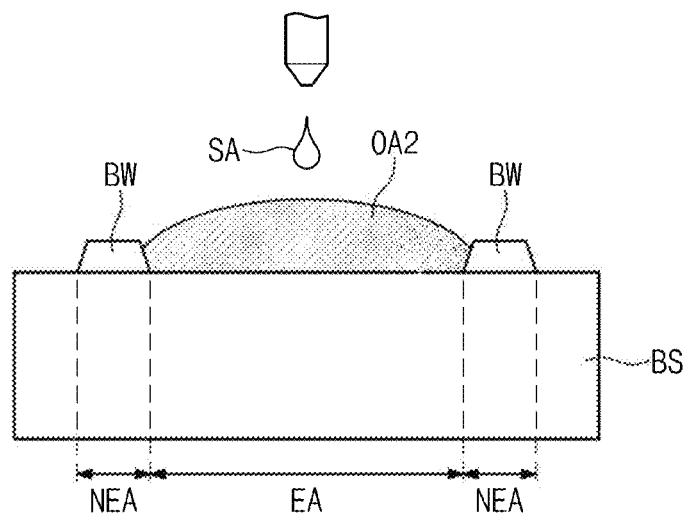

FIG. 1C shows the swelling of the intermediate organic layer OA1 by supplying the solvent SA to the intermediate organic layer OA1 (refer to FIG. 1B).

Referring to FIG. 1C, the solvent SA supplied to the intermediate organic layer OA1 swells the intermediate organic layer OA1 to form the swelled organic layer OA2.

The solvent SA is supplied to the intermediate organic layer OA1 of the first area EA. The solvent SA is supplied by the solution-based printing method, such as, for example, the inkjet printing method or the nozzle printing method. The solvent SA has a low boiling point, for example, about 200 Celsius degrees or less, and is selected from the groups consisting of propyleneglycolmonomethylether acetate, cyclohexanone, ethyl-3-ethoxypropionate, 3-methoxy-n-butylacetate, diethyleneglycolethylmethylether, diethyleneglycoldiethylether, anisole, 4-methoxytoluene, cyclohexanol, 2,3-butanediol, propane-1,2-diol, diethyleneglycol monomethyletheracetate, mesitylene, methylbenzoate, or a mixture thereof.

Figure 1D:
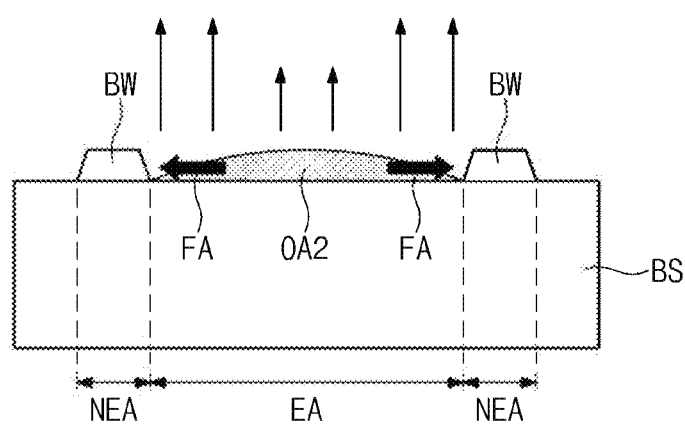

FIG. 1D shows the drying of the swelled organic layer OA2.

Referring to FIG. 1D, the organic solutes in the swelled organic layer OA2 move in a predetermined direction FA while the swelled organic layer OA2 is dried. The direction FA is a direction running from the center portion of the first area EA to the end portion of the first area EA. A concentration of steam of the solvent SA is reduced as it goes to the end portion of the first area EA from the center portion of the first area EA. Thus, a drying rate of the solvent increases as it goes to the end portion of the first area EA from the center portion of the first area EA. The organic solutes move to the direction FA by a coffee stain effect.

The drying of the swelled organic layer OA2 is performed in a vacuum state of about 100 Pa during one or more minutes by a vacuum drying method.

Figure 1E:
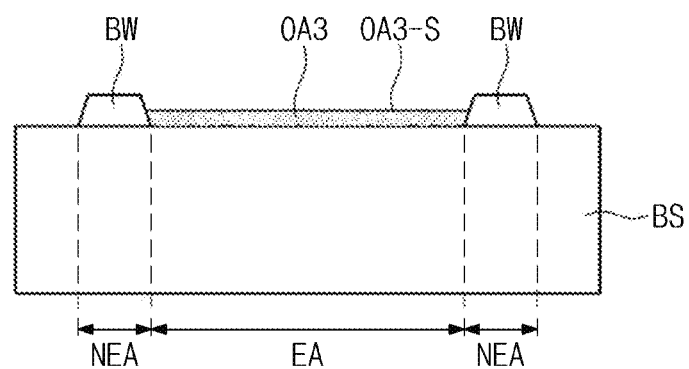

FIG. 1E shows a flat organic layer OA3 after the drying process of the organic layer OA2 is performed.

Referring to FIG. 1E, due to the organic solutes that move in the direction FA during the drying process, the flat organic layer OA3 having a uniform thickness is formed in the first area EA. A surface OA3-S of the flat organic layer OA3 has a flat surface structure in the first area EA.

Figure 4:
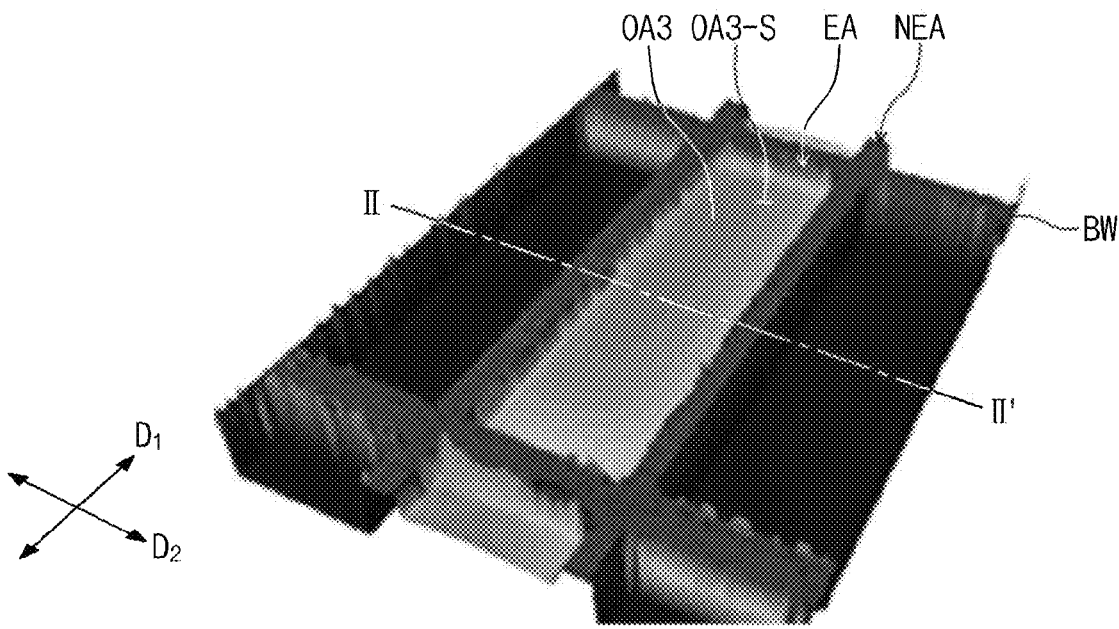
FIG. 4 is a three-dimensional profile view showing a flat organic layer according to an embodiment.
Figure 5:
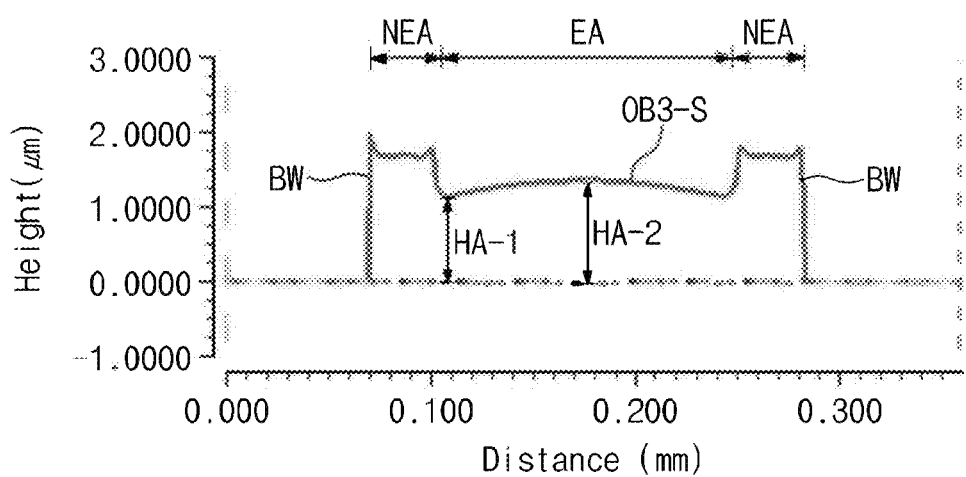
FIG. 5 is a cross-sectional profile view taken along a line II-II' shown in FIG. 4.

FIG. 4 is a three-dimensional profile view showing the flat organic layer according to an embodiment of the present disclosure and FIG. 5 is a cross-sectional profile view taken along a line II-II' shown in FIG. 4.

Referring to FIGS. 4 and 5, the flat organic layer OA3 is formed to have a uniform thickness in the first and second directions D1 and D2, and the surface OA3-S of the flat organic layer OA3 has a flat structure in the first and second directions D1 and D2.

FIGS. 6A to 6E are views showing a method of forming an organic layer according to another embodiment of the present disclosure.

Referring to FIGS. 6A to 6E, the method of forming the organic layer includes supplying a liquefied organic material OB, drying the organic material OB, supplying a solvent to an intermediate organic layer OB1 to swell the intermediate organic layer OB1, and drying the swelled organic layer OB2.

Hereinafter, the same reference numerals denote the same elements in FIGS. 1A to 1E, and thus descriptions of the same elements will be omitted.

Figure 6A:
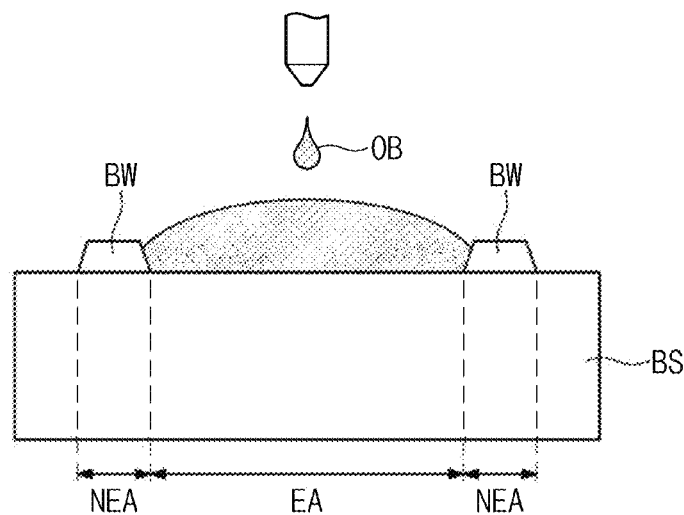
FIGS. 6A to 6E are views showing a method of forming an organic layer according to another embodiment.

FIG. 6A show the supplying of the organic material OB.

Referring to FIG. 6A, the organic material OB is supplied on the base substrate BS. The organic material OB includes an initial solvent, and organic solutes dissolved in the initial solvent. The organic material OB includes an organic light emitting material, a hole injection material, and a hole transporting material. The organic light emitting material includes at least one of a red organic light emitting material, a green organic light emitting material, or a blue organic light emitting material. The organic material OB is provided by a solution-based printing method, such as, for example, an inkjet printing method, a nozzle printing method, or the like. The inkjet printing method discharges the organic material OB onto the first area EA in a droplet shape. The nozzle printing method continuously discharges the organic material OB onto the first area EA through nozzles. The discharged organic material OB forms a layer with a convex surface structure in the first area EA.

Figure 6B:
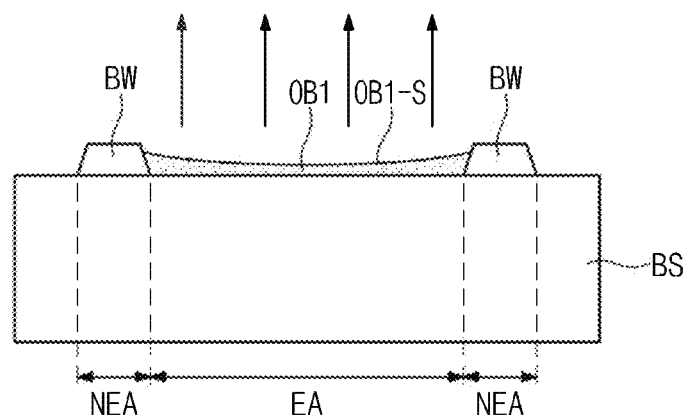

FIG. 6B shows the drying of the organic material OB.

Referring to FIG. 6B, the initial solvent contained in the organic material OB provided on the base substrate BS is dried and the organic solutes remain on the base substrate BS to form the intermediate organic layer OB1 in the first area EA of the base substrate BS. The intermediate organic layer OB1 has a thickness that gradually increases toward an end portion of the first area EA from a center portion of the first area EA. Thus, a surface OB1-S of the intermediate organic layer OB1 has a concave surface structure. The surface structure of the surface OB1-S of the intermediate organic layer OB1 is determined depending on the initial solvent of the organic material OB.

Figure 7:
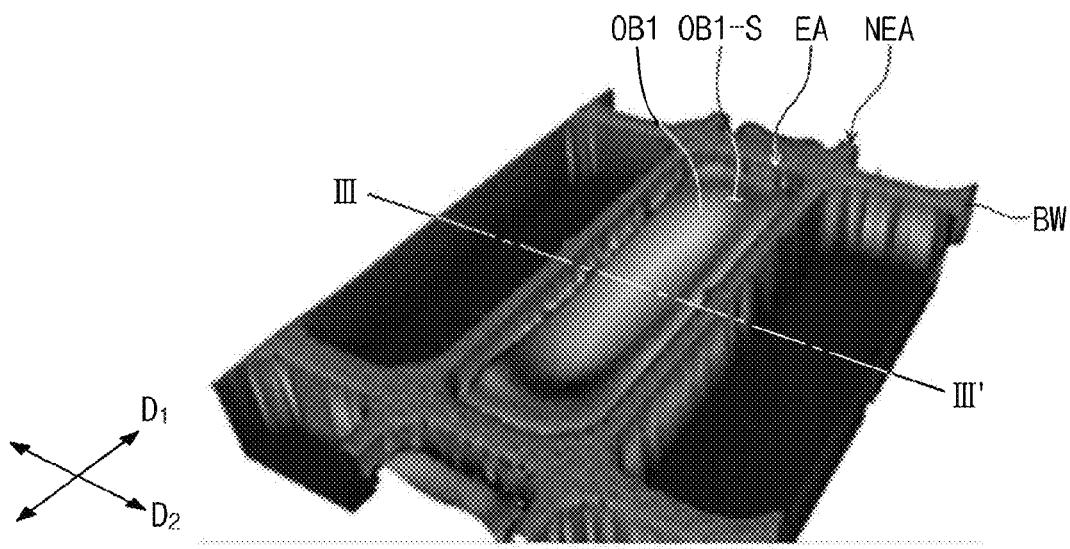
FIG. 7 is a three-dimensional profile view showing an intermediate organic layer according to another embodiment.
Figure 8:
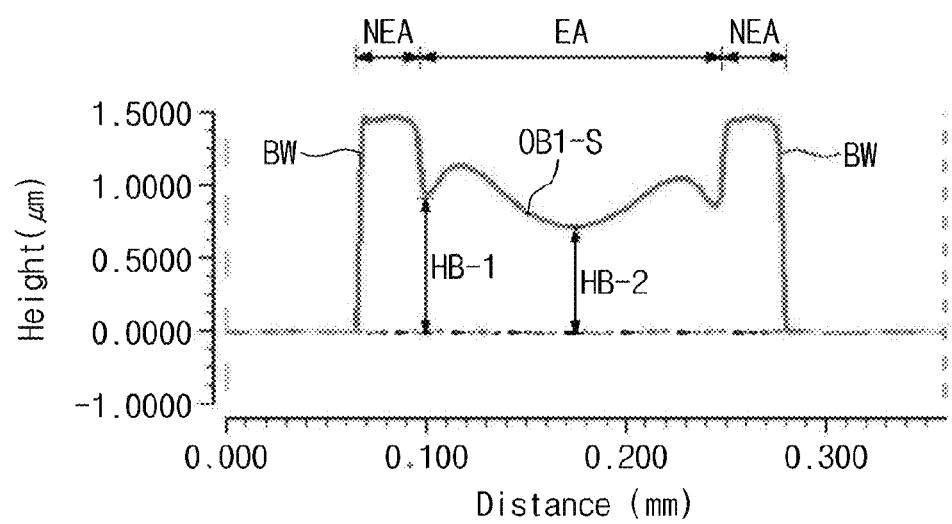
FIG. 8 is a cross-sectional profile view taken along a line shown in FIG. 7.

FIG. 7 is a three-dimensional profile view showing the intermediate organic layer, which is concave, according to another embodiment of the present disclosure and FIG. 8 is a cross-sectional profile view taken along a line shown in FIG. 7.

Referring to FIGS. 7 and 8, the concave intermediate organic layer OB1 has the concave surface structure in the first area EA. A difference between a thickness HB-2 of the intermediate organic layer OB1 at the center portion of the first area EA and a thickness HB-1 of the intermediate organic layer OB1 at the end portion of the first area EA is about a few hundreds of nanometers.

Figure 6C:
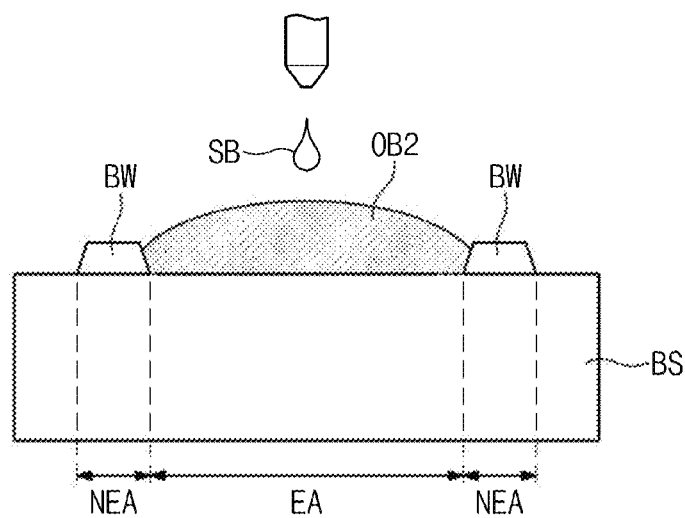

FIG. 6C shows the swelling of the intermediate organic layer OB1 by supplying the solvent SB to the intermediate organic layer OB1 (refer to FIG. 6B).

Referring to FIG. 6C, the solvent SB supplied to the intermediate organic layer OB1 swells the intermediate organic layer OB1 to form the swelled organic layer OB2.

The solvent SB has a high boiling point, for example, about 200 Celsius degrees or more, and is selected from the groups consisting of cyclohexylbenzene, 1,3-dimethyl-2-imidazolidinone, diethyleneglycolmonobutylether acetate, dibenzylether, diethylphthalate, dodecylbenzene, 1,2,3,4-tetramethylbenzene, 3-isopropylbiphenyl, 3-methylbiphenyl, 1,2,3,4-tetrahydronaphthalene, or a mixture thereof.

Figure 6D:
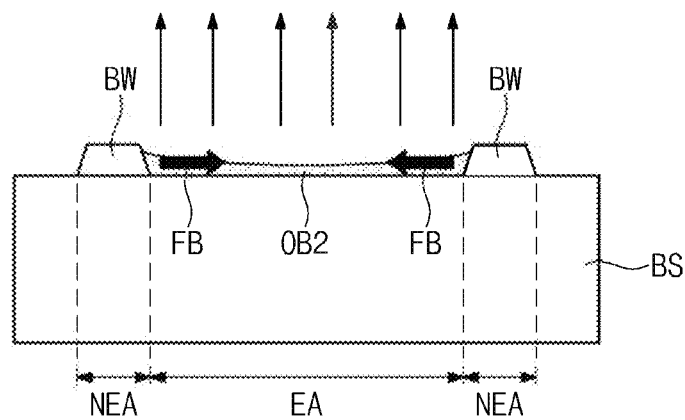

FIG. 6D shows the drying of the swelled organic layer OB2.

Referring to FIG. 6D, the organic solutes in the swelled organic layer OB2 move in a predetermined direction FB while the swelled organic layer OB2 is dried. The direction FB is a direction running from the end portion of the first area EA to the center portion of the first area EA. Since the drying rate of the high boiling point solvent SB is slower than the drying rate of the low boiling point solvent SA, the coffee stain effect, in which the organic solutes move to the end portion of the first area EA1, does not occur. The high boiling point solvent SB is slowly and uniformly dried in the whole area. Therefore, the organic solutes highly concentrated in the end portion of the first area EA move in the direction FB while the solvent SB is dried in the first area EA after the intermediate organic layer OB1 is swelled and the solvent FB.

Figure 6E:
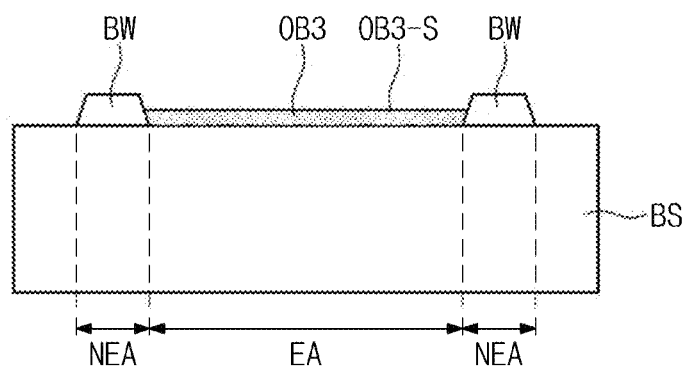

FIG. 6E shows a flat organic layer OB3 after the drying process is performed.

Referring to FIG. 6E, due to the organic solutes that move in the direction FB during the drying process, the flat organic layer OB3 having a uniform thickness is formed in the first area EA. A surface OB3-S of the flat organic layer OB3 has a flat surface structure in the first area EA.

Figure 9:
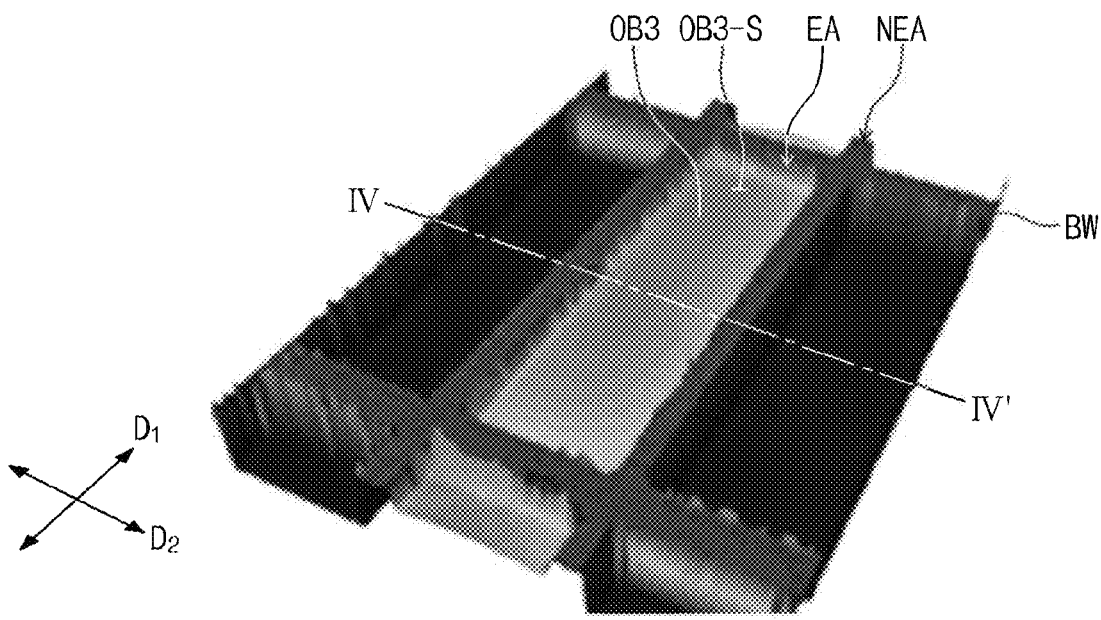
FIG. 9 is a three-dimensional profile view showing a flat organic layer according to another embodiment.
Figure 10:
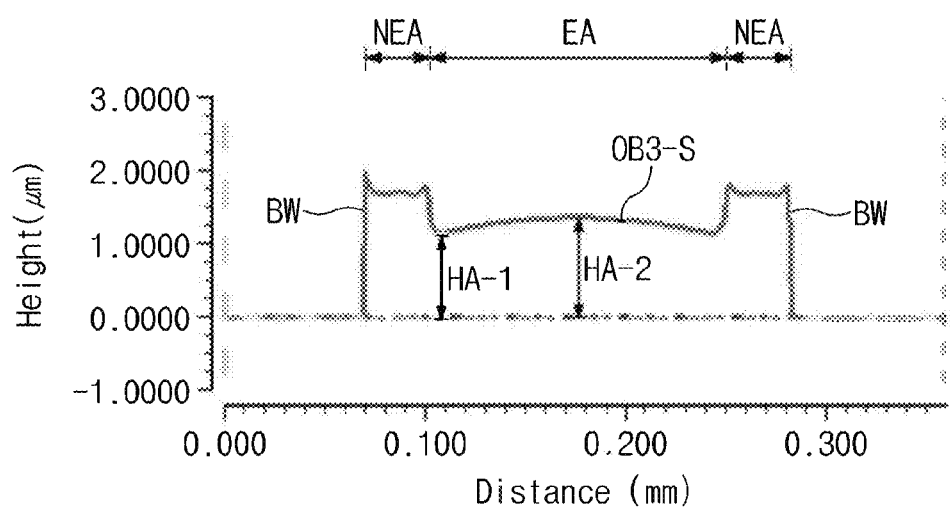
FIG. 10 is a cross-sectional profile view taken along a line IV-IV' shown in FIG. 9.

FIG. 9 is a three-dimensional profile view showing the flat organic layer according to another embodiment of the present disclosure and FIG. 10 is a cross-sectional profile view taken along a line IV-IV' shown in FIG. 9.

Referring to FIGS. 9 and 10, the flat organic layer OB3 is formed to have a uniform thickness in the first and second directions D1 and D2, and the surface OB3-S of the flat organic layer OB3 has the flat structure in the first and second directions D1 and D2.

FIGS. 11A to 11E are views showing a method of manufacturing an organic light emitting device according to another embodiment of the present disclosure.

Referring to FIGS. 11A to 11E, the method of manufacturing the organic light emitting device includes forming a first electrode, forming a hole function layer, forming an organic light emitting layer, forming an electron function layer, and forming a second electrode.

Figure 11A:
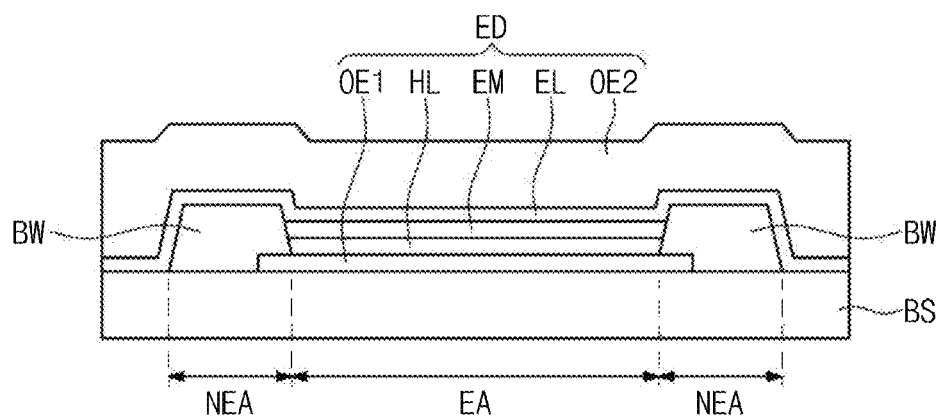
FIGS. 11A to 11E are views showing a method of manufacturing an organic light emitting device according to another embodiment.

FIG. 11A shows a cross-sectional view of the organic light emitting device.

Referring to FIG. 11A, the organic light emitting device includes a base substrate BS, the first electrode OE1 disposed on the base substrate BS, the hole function layer HL disposed on the first electrode OE1, the organic light emitting layer EM disposed on the hole function layer HL, the electron function layer EL disposed on the organic light emitting layer EM, and the second electrode OE2 disposed on the electron function layer EL.

Figure 11B:
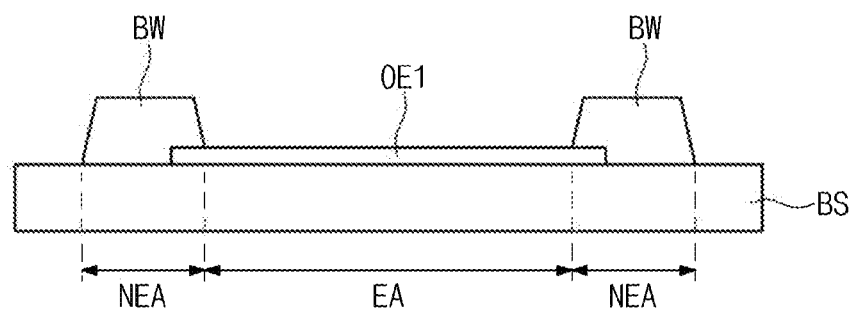

FIG. 11B shows the forming of the first electrode.

Referring to FIG. 11B, the first electrode OE1 and the barrier wall BW are formed on the base substrate BS. An end portion of the first electrode OE1 is covered by the barrier wall BW. The area in which the barrier wall BW is disposed is referred to as the second area NEA and the first area EA is surrounded by the second area NEA. The pixel is defined by the barrier wall BW. The first electrode OE1 is applied with a first voltage. The light emitted from the organic light emitting layer EM exits through the first electrode OE1 and the base substrate BS.

Figure 11C:
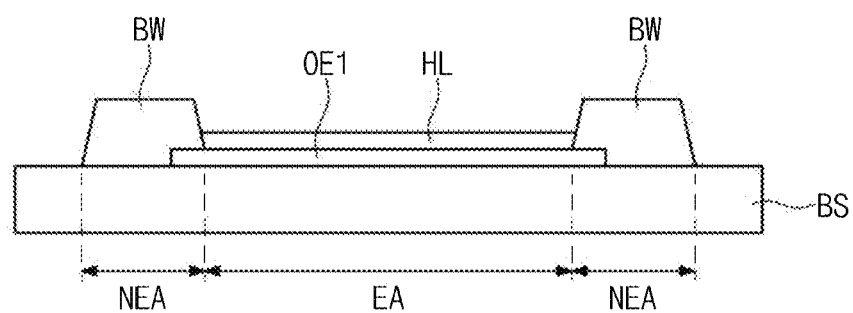

FIG. 11C shows the forming of the hole function layer.

Referring to FIG. 11C, the hole function layer HL is disposed on the first electrode OE1 and electrically makes contact with the first electrode OE1. The hole function layer HL is disposed in the first area EA. In addition, the hole function layer HL may be disposed in the second area NEA. The hole function layer HL is formed to be flat by the method of forming the flat organic layer (refer to FIGS. 1A to 1E and FIGS. 6A to 6E). The hole function layer HL includes a hole injection layer and further includes a hole transporting layer disposed between the hole injection layer and the organic light emitting layer EM. Holes are injected into the hole function layer HL from the first electrode OE1 and the holes are transported to the organic light emitting layer EM through the hole function layer HL.

Figure 11D:
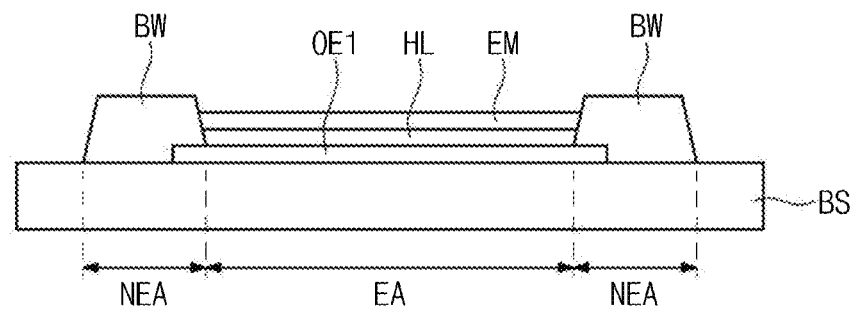

FIG. 11D shows the forming of the organic light emitting layer.

Referring to FIG. 11D, the organic light emitting layer EM is disposed on the hole function layer HL and electrically makes contact with the hole function layer HL. The organic light emitting layer EM may be disposed not only on the first area EA but also on the second area NEA. The organic light emitting layer EM is formed to be flat by the method of forming the flat organic layer (refer to FIGS. 1A to 1E and FIGS. 6A to 6E). The holes are transported to the organic light emitting layer EM through the hole function layer HL, and electrons are transported to the organic light emitting layer EM through the electron function layer EL. The holes and the electrons form excitons to emit light.

Figure 11E:
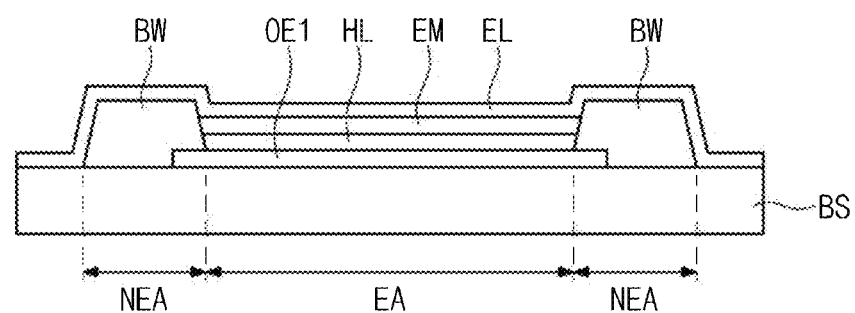

FIG. 11E shows the forming of the electron function layer.

Referring to FIG. 11E, the electron function layer EL is disposed on the organic light emitting layer EM and electrically makes contact with the organic light emitting layer EM. The electron function layer EL may be disposed not only on the first areas EA but also on the second area NEA. The electron function layer EL includes an electron injection layer and further includes an electron transporting layer disposed between the organic light emitting layer EM and the electron injection layer. The electrons are injected into and transported to the organic light emitting layer EM from the second electrode OE2 through the electron injection layer and the electron function layer EL.

As shown in FIG. 11A, the second electrode OE2 is disposed on the electron function layer EL and electrically makes contact with the electron function layer EL. The electrons are injected into the electron function layer EL by the second electrode OE2.

According to a conventional solution-based printing method, the organic layer is formed to be non-uniform in thickness while the solvent is dried. When the organic layer has a non-uniform thickness, an electric field is concentrated to the portion at which the thickness of the organic layer is relatively thin. As a result, the lifespan of the organic light emitting device is shortened or brightness of the light emitted from the organic light emitting device becomes non-uniform. In addition, the organic light emitting device does not emit the light due to a short occurring in the organic light emitting device, or line and point defects are formed. However, the organic layer of the organic light emitting device ED according to embodiments of the present disclosure is formed to be uniform in thickness. Thus, the electric field is uniformly formed in the whole of the first area EA. As a result, the lifespan of the organic light emitting device ED is not shortened and the organic light emitting device ED emits the light with uniform brightness.

Although certain embodiments of the present invention have been described, it is understood that the present invention should not be limited to these embodiments but various changes and modifications can be made by one ordinary skilled in the art within the spirit and scope of the present invention as hereinafter claimed.

What is claimed is:

1. A method of forming an organic layer, comprising:
   supplying a liquefied organic material on a base substrate;
   drying the liquefied organic material to form an intermediate organic layer;
   supplying a solvent to the intermediate organic layer to form a swelled organic layer; and
   drying the swelled organic layer to form a flat organic layer.

2. The method of claim 1, wherein the intermediate organic layer has a convex surface structure and the solvent has a low boiling point.

3. The method of claim 2, wherein the solvent is at least one of propyleneglycolmonomethylether acetate, cyclohexanone, ethyl-3-ethoxypropionate, 3-methoxy-n-butylacetate, diethyleneglycolethylmethylether, diethyleneglycoldiethylether, anisole, 4-methoxytoluene, cyclohexanol, 2,3-butanediol, propane-1,2-diol, diethyleneglycol monomethyletheracetate, mesitylene, methylbenzoate, or a mixture thereof.

4. The method of claim 1, wherein the intermediate organic layer has a concave surface structure and the solvent has a high boiling point.

5. The method of claim 4, wherein the solvent is at least one of cyclohexylbenzene, 1,3-dimethyl-2-imidazolidinone, diethyleneglycolmonobutylether acetate, dibenzylether, diethylphthalate, dodecylbenzene, 1,2,3,4-tetramethylbenzene, 3-isopropylbiphenyl, 3-methylbiphenyl, 1,2,3,4-tetrahydronaphthalene, or a mixture thereof.

6. The method of claim 1, wherein the liquefied organic material is supplied by an inkjet printing method or a nozzle printing method.

7. The method of claim 1, wherein the solvent is supplied by an inkjet printing method or a nozzle printing method.

8. The method of claim 1, further comprising forming at least one barrier wall on the base substrate to form an area to which the organic material is supplied.

9. A method of manufacturing an organic light emitting device, comprising:
   forming a first electrode on a base substrate;
   forming an organic light emitting layer on the first electrode; and
   forming a second electrode on the organic light emitting layer, the forming of the organic light emitting layer comprising:
   supplying a liquefied organic light emitting material on a base substrate;
   drying the liquefied organic light emitting material to form an intermediate organic light emitting layer;
   supplying a solvent to the intermediate organic light emitting layer to form a swelled organic light emitting layer; and
   drying the swelled organic light emitting layer to form a flat organic light emitting layer.

10. The method of claim 9, wherein the intermediate organic light emitting layer has a convex surface structure and the solvent has a low boiling point.

11. The method of claim 9, wherein the intermediate organic light emitting layer has a concave surface structure and the solvent has a high boiling point.

12. The method of claim 9, further comprising forming a hole injection layer on the first electrode.

13. The method of claim 12, wherein the forming of the hole injection layer comprises:
   supplying a liquefied hole injection material on the first electrode;
   drying the liquefied hole injection material to form an intermediate hole injection layer;
   supplying a solvent to the intermediate hole injection layer to form a swelled hole injection layer; and
   drying the swelled hole injection layer to form a flat hole injection layer.

14. The method of claim 12, further comprising forming a hole transporting layer on the hole injection layer.

15. The method of claim 14, wherein the forming of the hole transporting layer comprises:
   supplying a liquefied hole transporting material on the first electrode;
   drying the liquefied hole transporting material to form an intermediate hole transporting layer;
   supplying a solvent to the intermediate hole transporting layer to form a swelled hole transporting layer; and
   drying the swelled hole transporting layer to form a flat hole transporting layer.

16. The method of claim 9, further comprising forming an electron injection layer on the organic light emitting layer.

17. The method of claim 16, further comprising forming an electron transporting layer on the organic light emitting layer.

18. The method of claim 9, wherein the organic light emitting material is supplied by an inkjet printing method or a nozzle printing method.

19. The method of claim 9, wherein the solvent is supplied by an inkjet printing method or a nozzle printing method.

20. The method of claim 9, wherein the first electrode is applied with a first voltage and the second electrode is applied with a second voltage different than the first voltage.

* * * * *